United States Patent
Rothstein et al.

(10) Patent No.: US 12,038,271 B2
(45) Date of Patent: Jul. 16, 2024

(54) DETECTING OUTLIERS AND ANOMALIES FOR OCD METROLOGY MACHINE LEARNING

(71) Applicant: NOVA LTD, Rehovot (IL)

(72) Inventors: Eitan A. Rothstein, Rehovot (IL); Yongha Kim, Rehovot (IL); Ilya Rubinovich, Rehovot (IL); Ariel Broitman, Rehovot (IL); Olga Krasnykov, Rehovot (IL); Barak Bringoltz, Rehovot (IL)

(73) Assignee: NOVA LTD, Rehovot (IL)

( * ) Notice: Subject to any disclaimer, the term of this patent is extended or adjusted under 35 U.S.C. 154(b) by 0 days.

(21) Appl. No.: 17/790,962

(22) PCT Filed: Jan. 7, 2021

(86) PCT No.: PCT/IL2021/050028
§ 371 (c)(1),
(2) Date: Jul. 6, 2022

(87) PCT Pub. No.: WO2021/140515
PCT Pub. Date: Jul. 15, 2021

(65) Prior Publication Data
US 2023/0017097 A1    Jan. 19, 2023

Related U.S. Application Data

(60) Provisional application No. 62/957,825, filed on Jan. 7, 2020.

(51) Int. Cl.
*G01B 11/30* (2006.01)
*G03F 7/00* (2006.01)

(52) U.S. Cl.
CPC .......... *G01B 11/30* (2013.01); *G03F 7/70625* (2013.01); *G01B 2210/56* (2013.01)

(58) Field of Classification Search
CPC .. G01B 11/30; G01B 2210/56; G03F 7/70625
See application file for complete search history.

(56) References Cited

U.S. PATENT DOCUMENTS

| 7,318,051 B2 * | 1/2008 | Weston | G06F 18/2113 |
| | | | 706/12 |
| 10,482,464 B1 * | 11/2019 | Dietrich | G06Q 20/4016 |
| 2005/0192914 A1 | 9/2005 | Drege et al. | |

(Continued)

OTHER PUBLICATIONS

Geer, "Correlated observation error models for assimilating all-sky infrared radiances", Atmos. Meas. Tech., Jul. 4, 2019, pp. 3629-3657, vol. 12, Copernicus Publications, Göttingen, DE.

*Primary Examiner* — Mohamed Charioui
*Assistant Examiner* — Lynda Dinh
(74) *Attorney, Agent, or Firm* — AlphaPatent Associates Ltd.; Daniel J. Swirsky (57) ABSTRACT

A system and methods for OCD metrology are provided including receiving training data for training an OCD machine learning (ML) model, including multiple pairs of corresponding sets of scatterometric data and reference parameters. For each of the pairs, one or more corresponding outlier metrics are by calculated and corresponding outlier thresholds are applied whether a given pair is an outlier pair. The OCD MIL model is then trained with the training data less the outlier pairs.

17 Claims, 4 Drawing Sheets

(56) References Cited

U.S. PATENT DOCUMENTS

| | | | |
|---|---|---|---|
| 2012/0323356 A1* | 12/2012 | Dziura | G01B 11/06 |
| | | | 703/2 |
| 2012/0323556 A1 | 12/2012 | Dziura et al. | |
| 2014/0079312 A9 | 3/2014 | Brill | |
| 2014/0358485 A1* | 12/2014 | Lee | G03F 7/70625 |
| | | | 702/189 |
| 2015/0226680 A1 | 8/2015 | Turovets et al. | |
| 2015/0323316 A1 | 11/2015 | Shchegrov et al. | |
| 2018/0321168 A1* | 11/2018 | Sah | G01N 23/2251 |
| 2019/0088444 A1* | 3/2019 | Attal | G01B 15/04 |
| 2019/0285407 A1* | 9/2019 | Chuang | G03F 7/70625 |
| 2020/0111206 A1* | 4/2020 | Yati | G06V 10/764 |

\* cited by examiner

DETECTING OUTLIERS AND ANOMALIES FOR OCD METROLOGY MACHINE LEARNING

CROSS-REFERENCE TO RELATED APPLICATIONS

This application is a U.S. National Phase Application under 35 U.S.C. § 371 of International Application No. PCT/IL2021/050028, which has an international filing date of Jan. 7, 2021, and which claims the benefit of priority from U.S. Provisional Patent Application No. 62/957,825, filed Jan. 7, 2020.

FIELD OF THE INVENTION

The present invention relates generally to the field of optical inspection of integrated circuit wafer patterns, and in particular to algorithms for measurement of wafer pattern parameters.

BACKGROUND

Integrated circuits (ICs) are produced on semiconductor wafers through multiple steps of depositing, altering, and removing thin layers that build up into stacked structures on the wafers. These stacked structures, or "stacks," are typically formed in repetitive patterns that, like diffraction gratings, have optical properties. Modern metrology methods for measuring critical dimensions (CDs) and material properties of these patterns exploit these optical properties. Hereinbelow, CDs and material properties are also referred to as "pattern parameters," or simply as "parameters." These parameters may include the height, width, and pitch of stacks. As described by Dixit, et al., in "Sensitivity analysis and line edge roughness determination of 28-nm pitch silicon fins using Mueller matrix spectroscopic ellipsometry-based optical critical dimension metrology," J. Micro/Nanolith. MEMS MOEMS. 14(3), 031208 (2015), incorporated herein by reference, pattern parameters may also include: side wall angle (SWA), spacer widths, spacer pull-down, epitaxial proximity, footing/undercut, over-fill/under-fill of 2-dimentional (HKMG), 3-dimentional profile (Fin-FETs) and line edge roughness (LER).

Optical critical dimension (OCD) metrology employs methods of scatterometry to measure scatterometric data, that is, reflected light radiation that is indicative of optical properties of patterns. A measurement set of scatterometric data (which may also be referred to as a scatterometric signature) may include data points of reflected irradiance versus an incident angle of radiation (which may be zeroth-order measurements). Alternatively, or additionally, scatterometric data may include spectrograms that are measures of reflected radiation intensity over a range of wavelengths or frequencies. Additional types of scatterometric data known in the art may also be applied in OCD metrology.

U.S. Pat. No. 6,476,920 to Scheiner and Machavariani, "Method and apparatus for measurements of patterned structures," incorporated herein by reference, describes development of an "optical model" (also referred to as "physical model"), which is a function (i.e., a set of algorithms) defining a relation between reflected radiation and the physical structure of a wafer. That is, optical models are theoretical models, based on physical laws of optics, determining how light is reflected from patterns with known parameters. Such optical models can be applied to generate, from a set of known pattern parameters, an estimate of scatterometry data that would be measured during spectrographic testing. Optical models can also be designed to perform the converse (or "inverse") function, of predicting (i.e., "estimating") pattern parameters based on measured scatterometry data. Optical models used in practice are typically tuned to conform with measured data.

Optical models are commonly applied for OCD metrology during IC production to measure, based on scatterometric measurements, whether wafer patterns are being fabricated with correct parameters. Each pattern of a given wafer may be measured to determine how much the parameters of each patterns varies from a design specification or from a mean value.

As an alternative to optical modeling, machine learning (ML) techniques may be applied to predict pattern parameters based on scatterometry data. For example, as described in PCT patent application WO 2019/239380 to Rothstein, et al., incorporated herein by reference, a machine learning model may be trained to identify correspondences between measured scatterometry data and reference parameters measured by methods described below. After an ML model is trained to predict parameters from scatterometry data, it may then be applied to make such parameter predictions during IC production.

Exemplary scatterometric tools for measuring (acquiring) scatterometry data (e.g., spectrograms) may include spectral ellipsometers (SE), spectral reflectometers (SR), polarized spectral reflectometers, as well as other optical critical dimension (OCD) metrology tools. Such tools are incorporated into OCD metrology systems currently available. One such OCD metrology system is the NOVA T600® Advanced OCD Metrology tool, commercially available from Nova Measuring Instruments Ltd. of Rehovot, Israel, which takes measurements of pattern parameters that may be at designated test sites or "in-die." Additional methods for measuring critical dimensions (CDs) include interferometry, X-ray Raman spectrometry (XRS), X-ray diffraction (XRD), and pump-probe tools, among others. Some examples of such tools are disclosed in U.S. Pat. Nos. 10,161,885, 10,054,423, 9,184,102, and 10,119,925, and in international pending patent application publication WO2018/211505, all assigned to the Applicant and incorporated herein by reference in their entirety.

High accuracy methods of measuring pattern parameters that do not rely on the optical models described above include wafer measurements with equipment such as CD scanning electron microscopes (CD-SEMs), atomic force microscopes (AFMs), cross-section tunneling electron microscopes (TEMs), or X-ray metrology tools.

A shortcoming of ML modeling is the reliance on measured training data that is assumed to accurately reflect the characteristics of data that will be encountered in subsequent production. Problems with OCD equipment or system calibration may cause anomalies and measurement errors that are non-repeatable and not readily identified. In such cases, the training data will lead to training of ML models with features that are not indicative of real data characteristics.

Embodiments of the present invention as disclosed hereinbelow help to overcome these shortcomings.

SUMMARY

Embodiments of the present invention provide a system and methods for OCD metrology, providing steps that include receiving training data, for training an OCD machine learning (ML) model, including multiple pairs of corresponding input and output training data. The input data of each pair includes a set of scatterometric data measured from a wafer pattern and the output data of each pair includes a reference parameter measured from the same wafer pattern. For each of the pairs, one or more corresponding outlier metrics may be calculated, by calculating one or more of: 1) a difference between the reference parameter and a corresponding predicted parameter that is predicted from the corresponding set of scatterometric data; 2) a difference between a merit function of the set of scatterometric data and a deviation from a distribution of merit functions; and 3) a difference between the reference parameter and a mean or a median of reference parameters. For each of the one or more outlier metrics of each of the pairs, a corresponding outlier threshold may be applied to the outlier metric to determine whether the pair is an outlier pair, thereby determining, from among the training data, one or more outlier pairs. The OCD ML model may then be trained from the training data less the one or more outlier pairs. Training teaches the OCD ML model to predict, from new scatterometric data, respective new predicted parameters.

In some embodiments, calculating the one or more outlier metrics includes calculating a Cook's distance, which includes calculating a squared difference between the reference parameter and the corresponding predicted parameter, and multiplying the squared difference by a leverage factor. The leverage factor indicates an influence of the squared difference on the Cook's distance. After determining from the Cook's distance that a given pair is an outlier pair, the given outlier pair may be removed from the training data, after which a new Cook's distance may be calculated.

The distribution of merit functions may be a distribution of merit functions of all sets of scatterometric data in the training data, and the merit function for a given set of scatterometric data $S_i$ may be calculated by one or more of a Euclidian distance, a Minikowski distance, a Chebyshev distance, and a Mahalonbis distance between $S_i$ and all sets of scatterometric data in the training data. The outlier threshold may be a skewed box plot threshold, and an upper threshold W3 of the skewed box plot threshold may be a function of the form $W3 = a (IQR) e^{b\ MC}$, where IQR is the inter-quartile range of the distribution, a and b are constants in the range of 1 to 5, and MC is a medcouple function of the distribution.

In further embodiments, the one or more outlier metrics may be calculated as a difference between the reference parameter and a mean of all reference parameters in the training data set, and the outlier threshold may be a box plot threshold.

The reference parameter may be one of multiple reference parameters received in the training data and corresponding to a given set of scatterometric data. Each of the multiple reference parameters and the corresponding set of scatterometric data may be processed as a pair of corresponding input and output training data. In some embodiments, determining that a pair of training data is an outlier pair may include determining that other pairs of training data including the set of scatterometric data are also outlier pairs.

In some embodiments, the predicted parameters are predicted by applying an optical model or a previously generated ML model to the corresponding sets of scatterometric data. The reference parameters may be measured with high accuracy metrology by one or more of a CD scanning electron microscope (CD-SEM), an atomic force microscope (AFM), a cross-section tunneling electron microscope (TEM), or an X-ray metrology tool. The training data may be measured from multiple wafer patterns located on one or more wafers.

In further embodiments, there are also provided one or more non-transitory, machine-accessible storage media having instructions stored thereon, the instructions, when executed by a machine, causing the machine to implement the processes described above.

BRIEF DESCRIPTION OF DRAWINGS

For a better understanding of various embodiments of the invention and to show how the same may be carried into effect, reference is made, by way of example, to the accompanying drawings. Structural details of the invention are shown to provide a fundamental understanding of the invention, the description, taken with the drawings, making apparent to those skilled in the art how the several forms of the invention may be embodied in practice. In the figures.

DETAILED DESCRIPTION

Embodiments of the present invention provide systems and methods for generating machine learning (ML) models for optical critical dimension (OCD) monitoring, with outlier pre-processing of training data.

Figure 1:
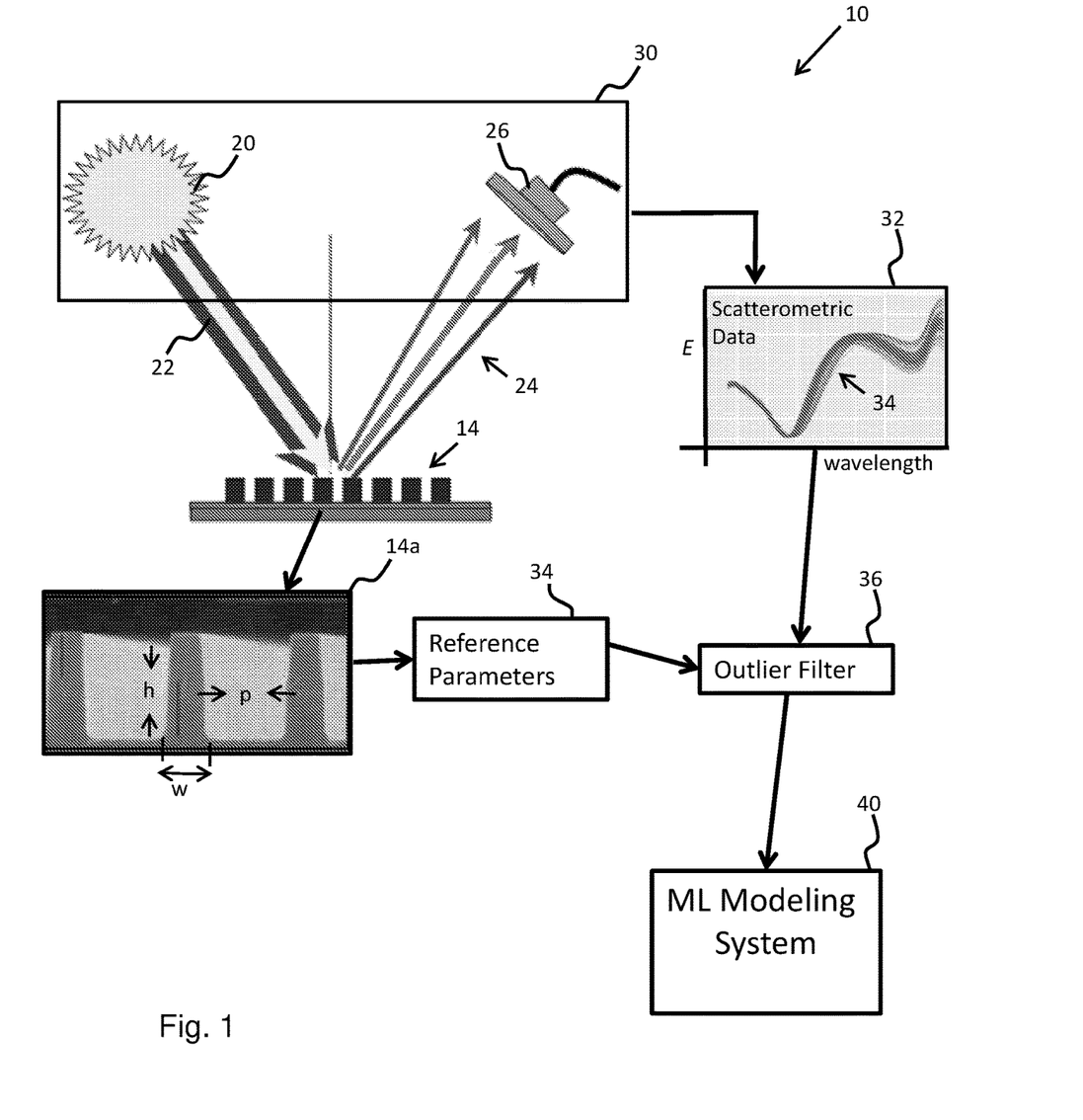
FIG. 1 is a schematic diagram of a system for generating a machine learning model for OCD metrology, with outlier pre-processing, in accordance with an embodiment of the present invention.

FIG. 1 is a schematic diagram of a system 10 for generating a machine learning model for OCD metrology, with outlier pre-processing, in accordance with an embodiment of the present invention.

The system 10 may operate within a production line (not shown) for production and monitoring of wafers 12. As indicated, wafers 12 include patterns 14. These patterns have parameters, such as height ("h"), width ("w"), and pitch ("p"), as indicated in the pattern enlargement 14a, as well as other parameters described in the Background above. Typically, wafers have multiple regions, or segments, or "dies" that are designed to have the same patterns (i.e., the same pattern design is used to manufacture all of the patterns), though fabrication variability may cause slight changes in these patterns. Machine learning models described above are typically designed to predict pattern parameters from a wide range of pattern geometries. For each pattern, a set of multiple parameters may be measured, referred to hereinbelow as "reference parameters." It is to be understood that where methods below are described with respect to a single reference parameter being measured from a given pattern, the method may be extended for the case of a set of multiple reference parameters being measured for the given pattern.

The system 10 includes a light source 20, which generates a beam of light 22 of a predetermined wavelength range. The beam of light 22 is reflected from the wafer patterns 14 (indicated as reflected, or "scattered," light 24) towards a spectrophotometric detector 26. In some configurations, the light source and spectrophotometric detector are included in an OCD metrology system 30 (e.g., ellipsometer or a spectrophotometer). The construction and operation of the metrology system 30 may be of any known kind, for example, such as disclosed in U.S. Pat. Nos. 5,517,312, 6,657,736, and 7,169,015, and in international pending patent application publication WO2018/211505, all assigned to the Applicant and incorporated herein by reference in their entirety. Typically the metrology system 30 includes additional components, not shown, such as light directing optics, which may include a beam deflector having an objective lens, a beam splitter and a mirror. Additional components of such systems may include imaging lenses, polarizing lenses, variable aperture stops, and motors. Operation of such elements is typically automated by computer controllers, which may include I/O devices and which may also be configured to perform data processing tasks, such as generating scatterometry data 32.

The scatterometry data 32 generated by the metrology system 30 typically includes various types of graphical data 34, which may be represented in vector form (e.g., a spectrogram, whose data points are measures of reflected light intensity at different light wavelengths, or a mapping of reflected irradiance vs. incident angle). As described above, variations between sets of scatterometric data are indicative of differing pattern parameters. In typical OCD metrology, the range of light that is measured may cover the visible light spectrum and may also include wavelengths in ultraviolet and infrared regions. A typical spectrogram output for OCD metrology may have 245 data points covering a wavelength range of 200 to 970 nm.

In embodiments of the present invention, sets of scatterometric data 32 from respective wafer patterns 14, and sets of corresponding reference parameters 34 from the same respective wafer patterns, are acquired as pairs of corresponding input and output training data for machine learning (ML). The sets of scatterometric data 32 are typically the input data, each set being paired with a set of corresponding reference parameters 34 that form the output data.

Before ML modeling is performed, a pre-processing outlier filter 36 may be employed to remove pairs of training data that have anomalous characteristics. Multiple methods of pre-processing outlier filtering are described hereinbelow. In some embodiments, multiple parallel methods are used to determine if pairs of training data are outlier pairs, such that a pair may be determined to be an outlier if any one or more of the methods indicates that it is an outlier.

After pre-processing, a computer system including ML tools known in the art, referred to herein as an ML modeling system 40, may be configured for training an ML model for OCD metrology. Input data typically includes the sets of scatterometric data 34, as described above, corresponding to the reference parameters 44, which may be used as target output for ML training. The reference parameters may be acquired from patterns of one or more wafers by high accuracy means known in the art, such as described above (e.g., CD-SEM, AFM, TEM, X-ray metrology, or high accuracy OCD spectroscopy relying on optical modeling). After training, the ML model is used to predict pattern parameters based on sets of scatterometric data, which may be applied, for example, in the monitoring of wafer production.

The ML modeling system 40 and the pre-processing outlier filter may operate independently of the metrology system 30 or the systems may be integrated into a single computing platform.

Figure 2:
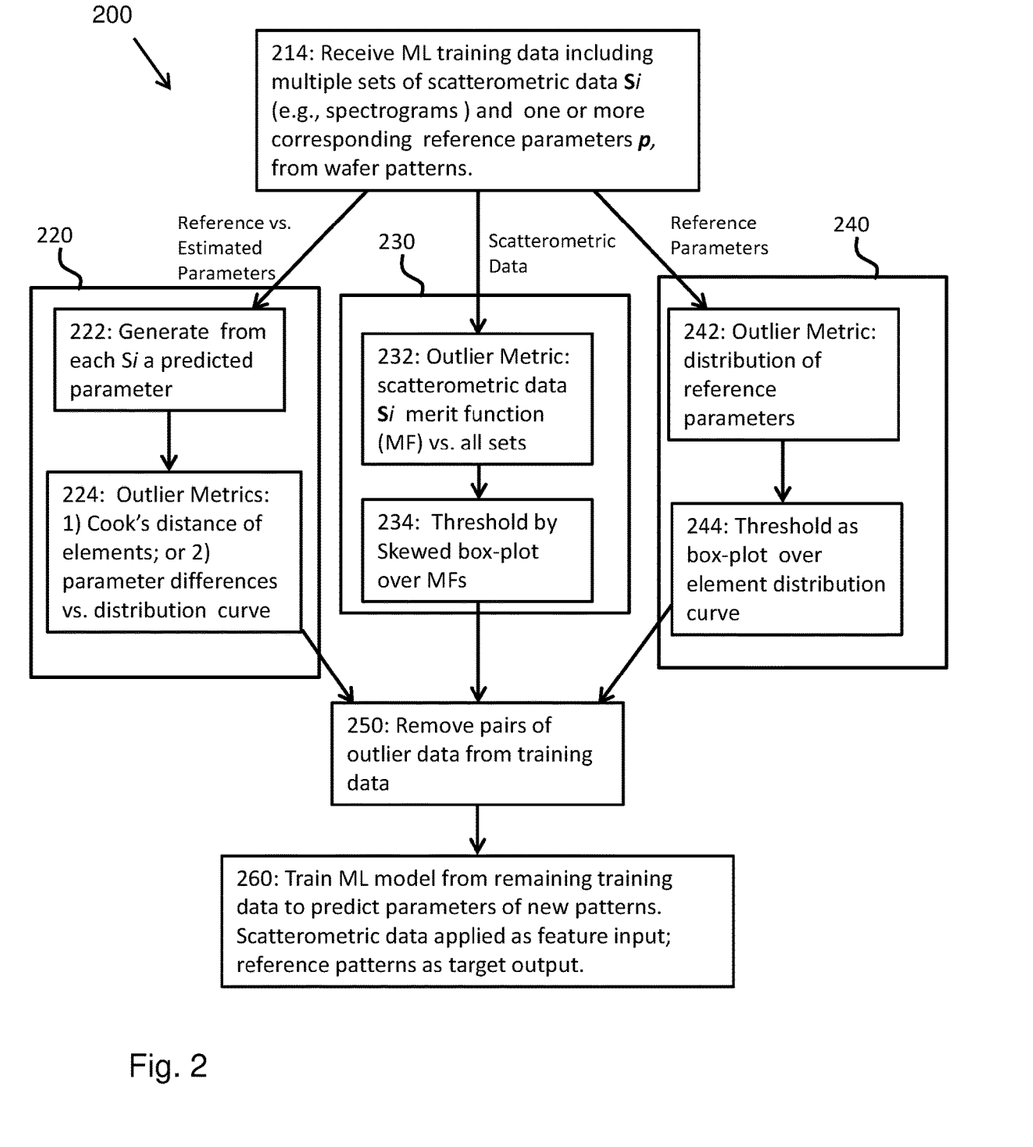
FIG. 2 is a flow diagram depicting a process for generating a machine learning model for OCD metrology, with outlier pre-processing, in accordance with an embodiment of the present invention.

FIG. 2 is a flow diagram depicting a process 200 for generating a machine learning model for OCD metrology, with outlier pre-processing, in accordance with an embodiment of the present invention; Process 200 may be implemented by the system 10 for OCD metrology, described above, and in particular by the pre-processing outlier filter 36 and by the ML modeling system 40.

A first step 214 includes receiving training data that will be used for subsequent training of a machine learning (ML) model for OCD metrology. For each wafer pattern a pair of input and output training data is received, as described above, the input data being a set of scatterometric data, and the output data being one or more reference parameters. Outlier methods described below refer to a single reference parameter being acquired for each pair of training data. If additional reference parameters are acquired for a given set of scatterometric data (i.e., with respect to a given wafer patter), then the methods described below may be implemented by considering each of the multiple reference parameters, together with its corresponding set of scatterometric data, to be a distinct pair of training data. (However, in some embodiments, if one pair including a given set of scatterometric data is determined to be an outlier pair, all pairs associated with that set of scatterometric data may be determined to be outlier pairs. Alternatively, such pairs may be treated separately with respect to outlier treatment.)

After data acquisition at step 214, three types of outlier filters may be applied to the training data pairs. Each type of filter determines a respective outlier metric with respect to the training data pair. Outlier metrics for the respective methods are then compared with respective outlier thresholds. In some embodiments, one or more of the outlier filters are operated in parallel, and a training pair is determined to be an outlier pair if any of the outlier filters determines it is an outlier pair (i.e., even if the pair is not an outlier according to some of the outlier filters.)

A first outlier filter 220 determines outliers based on comparing reference parameters with predicted parameters. At a first step 222 of the filter, a prediction model, such as an optical model or ML model, is applied to each set of acquired scatterometric data to generate a predicted parameter. (If each set of acquired scatterometric data is associated with multiple reference parameters, then multiple predicted parameters may be generated at step 222.)

At a second step 224 of the outlier filter, an outlier metric and subsequent outlier threshold are applied to determine if a difference between the corresponding reference and predicted parameters indicates that the corresponding pair of training data (i.e., the reference parameter and the corresponding set of scatterometric data) is an outlier pair.

One method of determining an outlier metric with respect to the difference between the reference and predicted parameters is to calculate the outlier metric as a Cook's distance. Cook's distance is typically used to measure outliers in a regression model. The formula for the Cook's distance, $D_i$ (i.e., the outlier metric), for a given data point i in a regression model is calculated as:

$$D_i = \frac{e_i^2}{A} \frac{h_{ii}}{(1-h_{ii})^2}.$$

To apply the Cook's distance in the case of pairs of reference and predicted parameters, the terms of the Cook's distance may be defined as follows.

The squared error term $e_i^2$ may be set to:

$e_i^2 = (p_i^{reference} - p_i^{predicted})^2$, that is, $e_i^2$ is set as the squared difference between the reference and predicted parameters.

The term "A" is a normalization constant, which may be set, for example, to 1.

The term $h_{ii}$ is a leverage term, indicating the weight of the given data point (i.e., the weight of the parameter pair) in the calculation of the Cook's distance. The terms $h_{ii}$ are the terms of the diagonal matrix H, which may be set according to the equation:

$$H = S(S^T S)^{-1} S^T,$$

where S is a matrix of all the sets of scatterometric data (i.e., for n sets of data, each of k data points, S is an n×k matrix). A typical threshold for determining whether a data point is an outlier is $D_i > 1$. A range of thresholds between 1 and 3 may be used depending on how restrictive the outlier threshold should be for a given environment. Alternatively, $D_i$ may be determined to be an outlier according to a percentile value using the F-distribution. A percentile of over 50 may be used as a threshold.

Alternatively or in addition to the Cook's distance, an outlier metric may be set with respect to the squared difference between the reference and predicted parameters, without the leverage function. For example, a distribution of squared differences of all pairs may be generated, and the difference of any pair's squared difference from a measure of the distribution may be used as an outlier metric. For example, a measure of the distribution may be in units of quartiles of the distribution, with a threshold set by a Tukey box plot threshold, as indicated in graph 300 of FIG. 3. Outliers may be determined as being outside an inter-quartile range (IQR), i.e., less than Q1 or greater than Q3. The box plot may include "whiskers," W1 and W3, extending beyond the respective Q1 and Q3 quartiles. For a skewed distribution, as indicated in the figure, the primary area of interest for determining outliers would be when the squared difference is greater than W3. Examples of setting such a threshold are described below with respect to outlier filter 230.

In parallel with filter 220, filters 230 and 240 may be applied in outlier preprocessing, the latter filters being implemented without generation of the additional corresponding predicted parameters.

Filter 230 calculates outlier metrics with respect to the sets of scatterometric data. Each set of scatterometric data may be indicated as vector $S_i$ (e.g., a vector of irradiance values for a given range of wavelengths). Each element k of a set (i.e., a data point corresponding to wavelength) may be indicated as $S_{ki}$. A mean value of all values of $S_{ki}$ may be indicated as $\bar{S}_k$. For each $S_i$, the outlier metric may be calculated as a distance to a representative distribution or vector of the multiple sets of scatterometric data. Such a distance is also referred to herein as a "merit function."

Various methods of calculating such a merit function are as follows.

1. Euclidian distance (measured as a difference between each element of a set $S_i$ and the average for all sets):

$$x_i^2 = \Sigma_k |S_{ki} - \bar{S}_k|^2.$$

2. Minikowski distance:

$$x_i = \left( \sum_k |S_{ki} - \bar{S}_k|^p \right)^{\frac{1}{p}}, \text{ with } p \geq 1$$

3. Chebyshev distance:

$$x_i = \max_k \left( |S_{ki} - \bar{S}_k| \right)$$

4. Mahalonbis distance:

$$x_i^2 = (S_i - \bar{S}_k)(S^T S)^{-1}(S_i - \bar{S}_k)^T,$$

where S is the matrix of all sets of scatterometric data, as described above.

Figure 3:
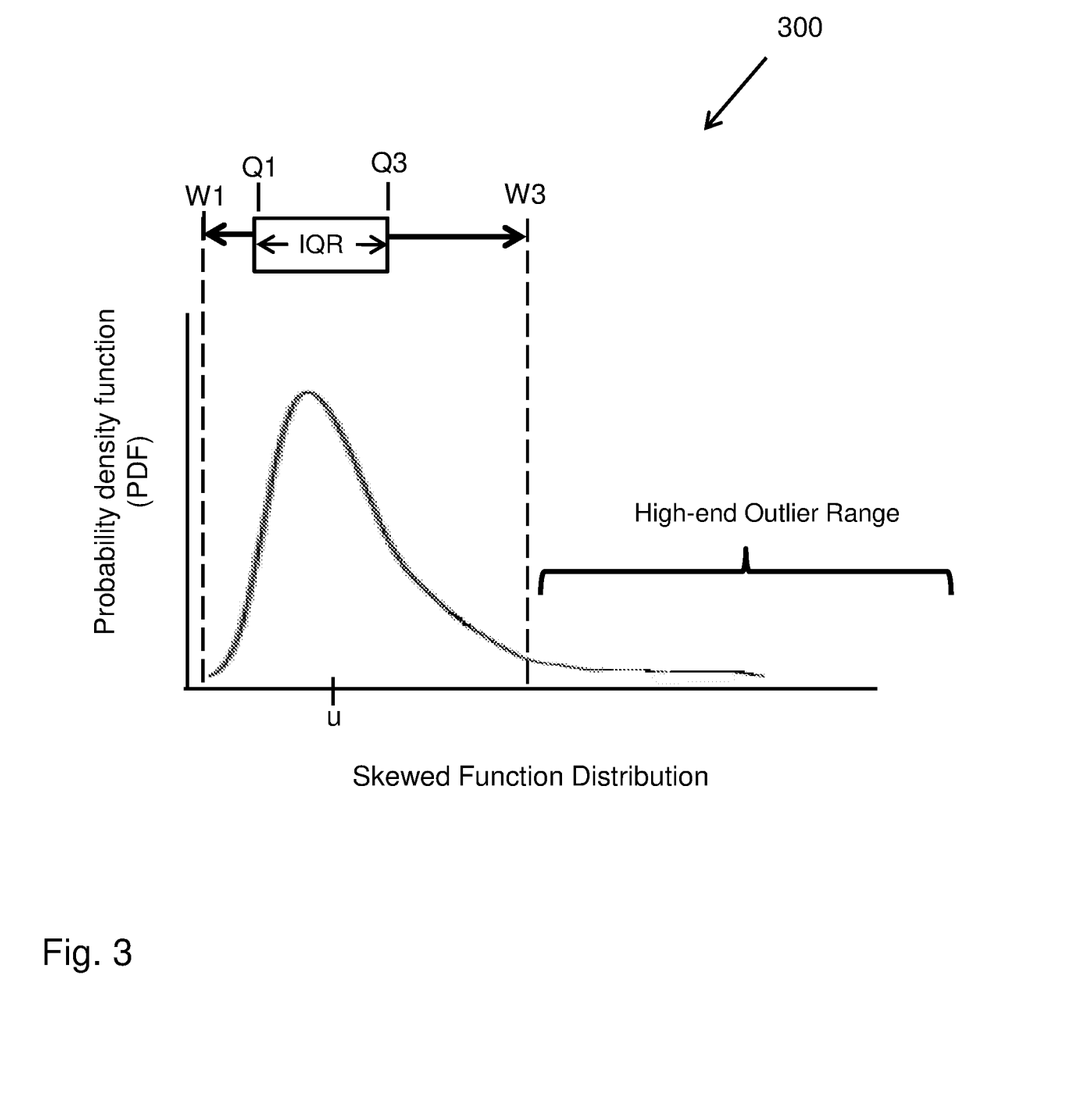
FIG. 3 is a graph indicating a box plot form of threshold setting, for outlier pre-processing, in accordance with an embodiment of the present invention.

The various examples of outlier metrics described above are "skewed" distributions, such as presented in FIG. 3. A one-side box plot may be used to set a threshold, that is, a box plot where W1 is set to the minimum distance, i.e., zero, such that outliers are only detected above the threshold W3. The threshold W3 may be set as a function of a "medcouple" (MC), described by Brys, et al., in "A robust measure of skewness," *Journal of Computational and Graphical Statistics*, 13 (4): 996-1017 (2004). An exemplary form of such a setting may be of the form:

W3 = a (IQR)$e^{b \cdot MC}$, where IQR is the inter-quartile range of the distribution, a and b are constants in the range of 1 to 5, and MC is the medcouple function.

The medcouple function MC may be calculated as:

$$MC = \mod_{x_i \leq Q_2 \leq x_j} h(x_i, x_j)$$

with $Q_2$ the sample median and where all $x_i \neq x_j$ the kernel function h is given by $$h(x_i, x_j) = \frac{(x_j - Q_2) - (Q_2 - x_i)}{x_j - x_i}.$$

Filter 240 calculates outlier metrics with respect to the reference parameters of the training data. A straightforward outlier metric may be determine, at a step 242, a normalized distance between a given reference parameter and a mean or median of all the reference parameters. As opposed to the skewed distribution of graph 300 of FIG. 3, such as distribution could be expected to be more symmetrical. A box plot threshold may then be set at a step 244 to determine pairs of training data that are outliers. The box plot may have "whiskers" extending beyond the Q1 and Q3 quartiles, might be set, for example, to 3×(IQR), in either direction. For reference parameters outside this range, the corresponding training data pair would be considered an outlier pair.

Following the parallel one or more steps of outlier filters described above, at a step 250 the outlier pairs would be removed from the training data before training of a ML model. Training would then be performed at a step 260. An ML model, such as a neural network described below with respect to FIG. 4, would be trained from the remaining training data. The resulting ML model, in production, would be used to predict parameters of new patterns from new scatterometric data.

Figure 4:
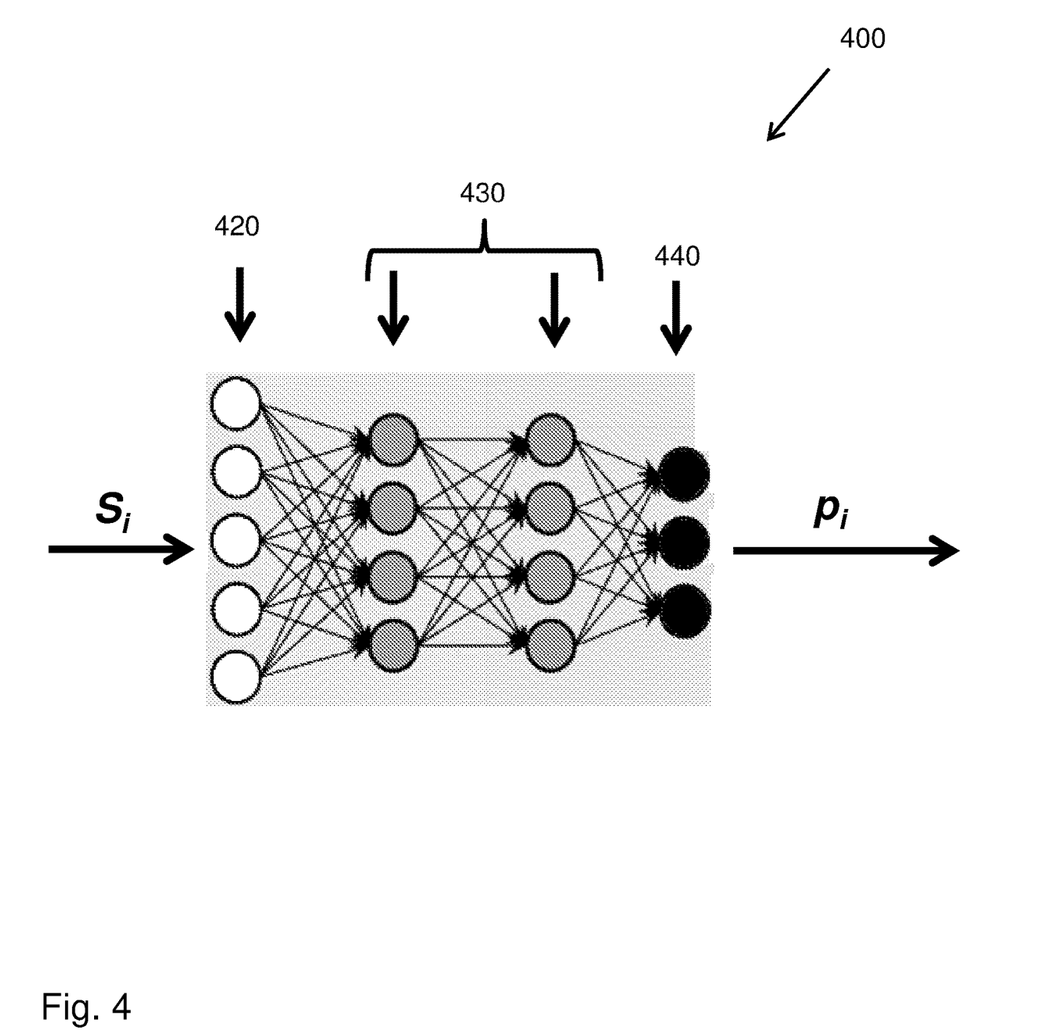
FIG. 4 is a schematic diagram of an exemplary neural network trained following outlier filtering, in accordance with an embodiment of the present invention.

FIG. 4 is a schematic diagram of an exemplary ML model, such as a neural network 400 that is trained following outlier filtering, in accordance with an embodiment of the present invention. During training, the pairs of training data not removed as outliers are provided in a supervised learning manner. Input data, i.e., the sets of scatterometric data Si, are fed to input layers 420, followed by hidden layers 430. The number of nodes of the output layer 440 is equal to the number corresponding reference parameters, i.e., if there are more than one set of "pairs" measured for each wafer pattern. These reference parameters, may be as shown in FIG. 1, e.g., height, width, and pitch of a given wafer stack. In effect, training the ML model creates a mapping that may subsequently be applied to new sets of scatterometric data to corresponding new predicted parameters. Training is typically performed according to standard ML training methods, which may include, for example, L2 regularization. Typically, the loss function that a NN is trained to minimize is a mean squared error (MSE) loss function. Preferably, validation would follow training, with a validation set of data using data sets acquired from different wafers than those used to acquire the data of the training data set. Methods of outlier filtering described above may also be applied in pre-processing of the validation data.

It is to be understood that processing elements shown or described herein are preferably implemented by one or more computers in computer hardware and/or in computer software embodied in a non-transitory, computer-readable medium in accordance with conventional techniques, such as employing a computer processor, a memory, I/O devices, and a network interface, coupled via a computer bus or alternate connection arrangement.

Unless otherwise described, the terms "processor" and "device" are intended to include any processing device, such as, for example, one that includes a CPU (central processing unit) and/or other processing circuitry (e.g., GPUs), and may refer to more than one processing device. Various elements associated with a processing device may be shared by other processing devices.

The term "memory" as used herein is intended to include memory associated with a processor or CPU, such as, for example, RAM, ROM, a fixed memory device (e.g., hard drive), a removable memory device (e.g., diskette, tapes), flash memory, etc. Such memory may be considered a computer readable storage medium.

In addition, phrases "input/output devices" or "I/O devices" may include one or more input devices (e.g., keyboard, mouse, scanner, HUD, etc.) for entering data to the processing unit, and/or one or more output devices (e.g., speaker, display, printer, HUD, AR, VR, etc.) for presenting results associated with the processing unit.

Embodiments of the invention may include a system, a method, and/or a computer program product. The computer program product may include a computer readable storage medium (or media) having computer readable program instructions thereon for causing a processor to carry out aspects of the invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), Blue-Ray, magnetic tape, Holographic Memory, a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the invention.

Where aspects of the invention are described herein with reference to flowchart illustrations and/or block diagrams of methods, apparatus (systems), and computer program products according to embodiments of the invention, it will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

Any flowchart and block diagrams included herein illustrate the architecture, functionality, and operation of possible implementations of systems, methods, and computer program products according to various embodiments of the invention. In this regard, each block in the flowchart or block diagrams may represent a module, segment, or portion of instructions, which comprises one or more executable instructions for implementing the specified logical function(s). In some alternative implementations, the functions noted in the block may occur out of the order shown herein. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A method for OCD metrology, comprising:
receiving training data for training an OCD machine learning (ML) model, wherein the training data includes multiple pairs of corresponding input and output training data, wherein the input training data of each pair includes a set of scatterometric data measured from a wafer pattern and wherein the output training data of each pair includes a reference parameter measured from the wafer pattern;
for each of the pairs, calculating one or more corresponding outlier metrics, by calculating one or more of 1) a difference between the reference parameter and a corresponding predicted parameter that is predicted from the corresponding set of scatterometric data, 2) a difference between a merit function of the set of scatterometric data and a deviation from a distribution of merit functions, and 3) a difference between the reference parameter and a mean or a median of reference parameters;
for each of the one or more outlier metrics of each of the pairs, applying a corresponding outlier threshold to the outlier metric to determine one or more outlier pairs in the training data; and
training the OCD ML model with the training data less the one or more outlier pairs, to train the OCD ML model to predict, from new scatterometric data, respective new predicted parameters,
wherein the distribution of merit functions is the distribution of merit functions of all sets of scatterometric data in the training data, and wherein a merit function for a given set of scatterometric data $S_i$ is calculated by one or more of a Euclidian distance, a Minikowski distance, a Chebyshev distance, and a Mahalonbis distance between $S_i$ and all the sets of scatterometric data in the training data, and
wherein the outlier threshold is a skewed box plot threshold, and an upper threshold W3 of the skewed box plot threshold is a function of $W3 = a \, (IQR) e^{b \, MC}$, wherein IQR is an inter-quartile range of the distribution, a and b are constants in a range of 1 to 5, and MC is a medcouple function of the distribution.

2. The method of claim 1, wherein calculating the one or more outlier metrics comprises calculating a Cook's distance, which comprises calculating a squared difference between the reference parameter and the corresponding predicted parameter, and multiplying the squared difference by a leverage factor, wherein the leverage factor indicates an influence of the squared difference on the Cook's distance.

3. The method of claim 2, further comprising determining from the Cook's distance that a given pair is an outlier pair, responsively removing the given outlier pair from the training data, and calculating a new Cook's distance.

4. The method of claim 1, wherein the one or more outlier metrics is calculated as a difference between the reference parameter and a mean of all reference parameters in the training data set, and wherein the outlier threshold is a box plot threshold.

5. The method of claim 1, wherein the reference parameter is one of multiple reference parameters received in the training data corresponding to a set of scatterometric data, and wherein each of the multiple reference parameters and the corresponding set of scatterometric data comprises a pair of corresponding input and output training data.

6. The method of claim 1, wherein the predicted parameters are predicted by applying an optical model or a previously generated ML model to the corresponding sets of scatterometric data.

7. The method of claim 1, wherein the reference parameters are measured by one or more of a CD scanning electron microscope (CD-SEM), an atomic force microscope (AFM), a cross-section tunneling electron microscope (TEM), or an X-ray metrology tool.

8. The method of claim 1, wherein the training data are measured from multiple wafer patterns located on one or more wafers.

9. A system for OCD metrology compromising a processor having non-transient memory, the memory including instructions that when executed by the processor cause the processor to implement steps of:
receiving training data for training an OCD machine learning (ML) model, wherein the training data includes multiple pairs of corresponding input and output training data, wherein the input training data of each pair includes a set of scatterometric data measured from a wafer pattern and wherein the output training data of each pair includes a reference parameter measured from the wafer pattern;

for each of the pairs, calculating one or more corresponding outlier metrics, by calculating one or more of 1) a difference between the reference parameter and a corresponding predicted parameter that is predicted from the corresponding set of scatterometric data, 2) a difference between a merit function of the set of scatterometric data and a deviation from a distribution of merit functions, and 3) a difference between the reference parameter and a mean or a median of reference parameters;

for each of the one or more outlier metrics of each of the pairs, applying a corresponding outlier threshold to the outlier metric to determine one or more outlier pairs in the training data; and training the OCD ML model with the training data less the one or more outlier pairs, to train the OCD ML model to predict, from new scatterometric data, respective new predicted parameters, wherein the distribution of merit functions is the distribution of merit functions of all sets of scatterometric data in the training data, and wherein a merit function for a given set of scatterometric data $S_i$ is calculated by one or more of a Euclidian distance, a Minikowski distance, a Chebyshev distance, and a Mahalonbis distance between $S_i$ and all the sets of scatterometric data in the training data, and wherein the outlier threshold is a skewed box plot threshold, and an upper threshold W3 of the skewed box plot threshold is a function of $W3=a(IQR)e^{b\ MC}$, wherein IQR is an inter-quartile range of the distribution, a and b are constants in a range of 1 to 5, and MC is a medcouple function of the distribution.

10. The system of claim 9, wherein calculating the one or more outlier metrics comprises calculating a Cook's distance, which comprises calculating a squared difference between the reference parameter and the corresponding predicted parameter, and multiplying the squared difference by a leverage factor, wherein the leverage factor indicates an influence of the squared difference on the Cook's distance.

11. The system of claim 10, further comprising determining from the Cook's distance that a given pair is an outlier pair, responsively removing the given outlier pair from the training data, and calculating a new Cook's distance.

12. The system of claim 9, wherein the one or more outlier metrics is calculated as a difference between the reference parameter and a mean of all reference parameters in the training data set, and wherein the outlier threshold is a box plot threshold.

13. The system of claim 9, wherein the reference parameter is one of multiple reference parameters received in the training data corresponding to a set of scatterometric data, and wherein each of the multiple reference parameters and the corresponding set of scatterometric data comprises a pair of corresponding input and output training data.

14. The system of claim 9, wherein the predicted parameters are predicted by applying an optical model or a previously generated ML model to the corresponding sets of scatterometric data.

15. The system of claim 9, wherein the reference parameters are measured by one or more of a CD scanning electron microscope (CD-SEM), an atomic force microscope (AFM), a cross-section tunneling electron microscope (TEM), or an X-ray metrology tool.

16. The system of claim 9, wherein the training data are measured from multiple wafer patterns located on one or more wafers.

17. A non-transitory, machine-accessible storage medium having instructions stored thereon, the instructions, when executed by a machine, causing the machine to implement steps of:

receiving training data for training an OCD machine learning (ML) model, wherein the training data includes multiple pairs of corresponding input and output training data, wherein the input training data of each pair includes a set of scatterometric data measured from a wafer pattern and wherein the output training data of each pair includes a reference parameter measured from the wafer pattern;

for each of the pairs, calculating one or more corresponding outlier metrics, by calculating one or more of 1) a difference between the reference parameter and a corresponding predicted parameter that is predicted from the corresponding set of scatterometric data, 2) a difference between a merit function of the set of scatterometric data and a deviation from a distribution of merit functions, and 3) a difference between the reference parameter and a mean or a median of reference parameters;

for each of the one or more outlier metrics of each of the pairs, applying a corresponding outlier threshold to the outlier metric to determine one or more outlier pairs in the training data; and training the OCD ML model with the training data less the one or more outlier pairs, to train the OCD ML model to predict, from new scatterometric data, respective new predicted parameters, wherein the distribution of merit functions is the distribution of merit functions of all sets of scatterometric data in the training data, and wherein a merit function for a given set of scatterometric data $S_i$ is calculated by one or more of a Euclidian distance, a Minikowski distance, a Chebyshev distance, and a Mahalonbis distance between $S_i$ and all the sets of scatterometric data in the training data, and wherein the outlier threshold is a skewed box plot threshold, and an upper threshold W3 of the skewed box plot threshold is a function of $W3=a\ (IQR)e^{b\ MC}$, wherein IQR is an inter-quartile range of the distribution, a and b are constants in a range of 1 to 5, and MC is a medcouple function of the distribution.

* * * * *